United States Patent
Hitokawa et al.

(10) Patent No.: US 12,441,822 B2
(45) Date of Patent: Oct. 14, 2025

(54) POLYMER, SEMICONDUCTOR COMPOSITION COMPRISING POLYMER, AND METHOD FOR MANUFACTURING FILM USING SEMICONDUCTOR COMPOSITION

(71) Applicant: Merck Patent GmbH, Darmstadt (DE)

(72) Inventors: Hiroshi Hitokawa, Kakegawa (JP); Tomohide Katayama, Kakegawa (JP); Tomotsugu Yano, Kakegawa (JP); Rui Zhang, Kakegawa (JP); Aritaka Hishida, Kakegawa (JP); Masato Suzuki, Kakegawa (JP); Rikio Kozaki, Kakegawa (JP); Toshiya Okamura, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 656 days.

(21) Appl. No.: 17/431,974

(22) PCT Filed: Feb. 17, 2020

(86) PCT No.: PCT/EP2020/054001
§ 371 (c)(1),
(2) Date: Aug. 18, 2021

(87) PCT Pub. No.: WO2020/169493
PCT Pub. Date: Aug. 27, 2020

(65) Prior Publication Data
US 2022/0119568 A1    Apr. 21, 2022

(30) Foreign Application Priority Data

Feb. 19, 2019    (JP) .................... 2019-027296

(51) Int. Cl.
| | | |
|---|---|---|
| G03F 7/039 | (2006.01) |
| C08F 220/28 | (2006.01) |
| C08F 220/30 | (2006.01) |
| C08F 220/34 | (2006.01) |
| G03F 7/004 | (2006.01) |
| G03F 7/038 | (2006.01) |
| G03F 7/20 | (2006.01) |
| G03F 7/32 | (2006.01) |
| H01L 21/027 | (2006.01) |
| H01L 21/308 | (2006.01) |

(52) U.S. Cl.
CPC ...... *C08F 220/346* (2020.02); *C08F 220/281* (2020.02); *C08F 220/301* (2020.02); *G03F 7/0045* (2013.01); *G03F 7/0382* (2013.01); *G03F 7/0392* (2013.01); *G03F 7/2006* (2013.01); *G03F 7/32* (2013.01); *H01L 21/0276* (2013.01); *H01L 21/3081* (2013.01); *H01L 21/3086* (2013.01)

(58) Field of Classification Search
None
See application file for complete search history.

(56) References Cited

U.S. PATENT DOCUMENTS

| | | | |
|---|---|---|---|
| 7,861,590 B2 | 1/2011 | Hiroi | |
| 10,031,394 B2 | 7/2018 | Nakayama et al. | |
| 2009/0217759 A1 | 9/2009 | Hiroi | |
| 2009/0280435 A1 | 11/2009 | Mckenzie et al. | |
| 2011/0076626 A1* | 3/2011 | Padmanaban | G03F 7/091 430/326 |
| 2012/0208939 A1* | 8/2012 | Aoki | C10M 169/04 106/38.22 |
| 2012/0308939 A1* | 12/2012 | Kudo | C09D 5/006 430/326 |
| 2014/0087311 A1* | 3/2014 | Nakasugi | G03F 7/038 544/219 |
| 2014/0135426 A1* | 5/2014 | Sakaguchi | C08J 5/18 523/400 |
| 2014/0200304 A1* | 7/2014 | Soda | C09D 139/04 524/548 |
| 2014/0275378 A1 | 9/2014 | Kondo | |
| 2015/0194312 A1* | 7/2015 | Someya | G03F 7/40 438/703 |
| 2016/0349617 A1 | 12/2016 | Hirano et al. | |
| 2019/0055359 A1* | 2/2019 | Sugawara | C08G 75/04 |
| 2019/0085130 A1 | 3/2019 | Yukawa et al. | |
| 2019/0171107 A1 | 6/2019 | Hitokawa et al. | |
| 2019/0317405 A1 | 10/2019 | Nishita et al. | |
| 2020/0019061 A1 | 1/2020 | Yukawa et al. | |
| 2022/0229366 A1* | 7/2022 | Haga | G03F 7/38 |

FOREIGN PATENT DOCUMENTS

| | | | |
|---|---|---|---|
| CN | 102016719 A | 4/2011 | |
| CN | 104995560 A * | 10/2015 | G03F 7/40 |
| CN | 108351593 A | 7/2018 | |
| CN | 109564388 A | 4/2019 | |
| JP | 2002357690 A * | 12/2002 | |
| JP | 2008203737 A * | 9/2008 | |
| JP | 2008-257166 A | 10/2008 | |
| JP | 2012108182 A * | 6/2012 | |
| JP | 2014-071424 A | 4/2014 | |
| JP | 2016-224282 A | 12/2016 | |

(Continued)

OTHER PUBLICATIONS

International Search Report and Written Opinion received for PCT Patent Application No. PCT/EP2020/054001, mailed on May 6, 2020, 8 pages.

(Continued)

*Primary Examiner* — Martin J Angebranndt
(74) *Attorney, Agent, or Firm* — Faegre Drinker Biddle & Reath LLP

(57) ABSTRACT

To provide a novel polymer capable of reducing sublimate during film formation and a composition comprising the same. The polymer (A) according to the present invention comprises at least one structural unit selected from the group consisting of Unit (a), Unit (b), Unit (c) and Unit (d) having certain structures, wherein, $n_a$, $n_b$, $n_c$ and $n_d$, which are the numbers of repetition respectively of Units (a), (b), (c) and (d), satisfy the following formulae: $n_a+n_b>0$, $n_c \geq 0$ and $n_d \geq 0$.

15 Claims, No Drawings

(56) References Cited

FOREIGN PATENT DOCUMENTS

| | | | | |
|---|---|---|---|---|
| JP | 2017126530 A | * | 7/2017 | |
| KR | 2009025488 A | * | 3/2009 | ............ G03F 7/004 |
| KR | 2014023841 A | * | 2/2014 | ........... C07C 309/73 |
| KR | 2014085123 A | * | 7/2014 | |
| KR | 10-2018-0133230 A | | 12/2018 | |
| TW | 201710797 A | | 3/2017 | |
| TW | 201803910 A | | 2/2018 | |
| WO | 2007/111147 A1 | | 10/2007 | |
| WO | 2009/136242 A1 | | 11/2009 | |
| WO | 2011/101737 A1 | | 8/2011 | |
| WO | WO-2012081619 A1 | * | 6/2012 | ............ G03F 7/091 |
| WO | WO-2014091818 A1 | * | 6/2014 | ............ C08F 220/20 |
| WO | WO-2016098578 A1 | * | 6/2016 | ............ C08F 212/32 |
| WO | 2017/170828 A1 | | 10/2017 | |
| WO | 2018/029053 A1 | | 2/2018 | |
| WO | 2018/056281 A1 | | 3/2018 | |
| WO | 2018/226016 A1 | | 12/2018 | |

OTHER PUBLICATIONS

Houlihan et al., "Implant Resist Approaches for 193nm Second Generation Radiation Sensitive Developable Bottom Anti Reflective Coating", Journal of Photopolymer Science and Technology, vol. 20, Issue 3, Sep. 15, 2007, pp. 359-364.

* cited by examiner

POLYMER, SEMICONDUCTOR COMPOSITION COMPRISING POLYMER, AND METHOD FOR MANUFACTURING FILM USING SEMICONDUCTOR COMPOSITION

CROSS-REFERENCE TO RELATED APPLICATIONS

This application is a national stage application (under 35 U.S.C. § 371) of PCT/EP2020/054001, filed Feb. 17, 2020, which claims benefit of Japanese Application No. 2019-027296, filed Feb. 19, 2019, both of which are incorporated herein by reference in their entirety.

BACKGROUND OF THE INVENTION

Technical Field

The present invention relates to a polymer comprising certain structural units and a semiconductor composition comprising the polymer. Further, the present invention also relates to methods for manufacturing a film and a device, using the semiconductor composition.

Background Art

In the process of manufacturing devices such as semiconductors, fine processing by lithography technology using a photoresist has been generally performed. The fine processing process comprises the processes of: forming a thin resist layer on a semiconductor substrate such as a silicon wafer, covering the layer with a mask pattern corresponding to a desired device pattern, irradiating the layer with an active light such as ultraviolet radiation through the mask pattern, developing the exposed layer to obtain a photoresist pattern, and etching the substrate using the obtained photoresist pattern as a protective film, whereby a fine unevenness corresponding to the above-described pattern is formed.

In these photolithography processes, there causes a problem that dimensional accuracy of the photoresist pattern is lowered due to the influence of standing wave resulting from reflection of the light from the substrate and the influence of irregular reflection of the exposure light resulting from the level difference of the substrate. Therefore, in order to solve this problem, a method for providing a bottom anti-reflective coating has been widely studied. The characteristics required for such a bottom anti-reflective coating include having a large absorbance to the radiation used for exposure of the photoresist, preventing irregular reflection and the like to make the cross section of the photoresist after exposure and development perpendicular to the substrate surface, having poor solubility in a solvent contained in the photoresist composition (intermixing hardly occurs), and the like.

Patent Document 1 discloses an anti-reflective coating composition comprising a crosslinker. Patent Document 2 discloses a composition for forming a fine resist pattern comprising a certain polymer, but it does not disclose whether or not a bottom anti-reflective coating can be formed and whether or not it has characteristics required as a bottom anti-reflective coating.

PRIOR ART DOCUMENTS

Patent Documents

[Patent Document 1] WO 2011/101737
[Patent Document 2] JP 2014-71424 A
[Patent Document 3] WO 2007/111147

SUMMARY OF THE INVENTION

Problems to be Solved by the Invention

The present inventors considered that there are one or more problems still need improvements. These include, for example, the followings: reduction of sublimates; appropriate etching resistance; coating properties; filling properties into complicated and fine substrates (for example, substrates having level difference); capability of film formation at low temperature; large absorbance; suitable refractive index; reduction of standing wave; reduction of intermixing with other composition (for example, resist composition) and film; flatness of upper surface of the formed film; high solubility of solute; storage stability; good shape of the formed resist pattern, high yield, and low LWR.

The present invention has been made based on the technical background as described above and provides a novel polymer and a composition comprising the same.

Means for Solving the Problems

The polymer (A) according to the present invention comprises at least one structural unit selected from the group consisting of the following Units (a), (b), (c) and (d):

Unit (a) represented by the formula (a):

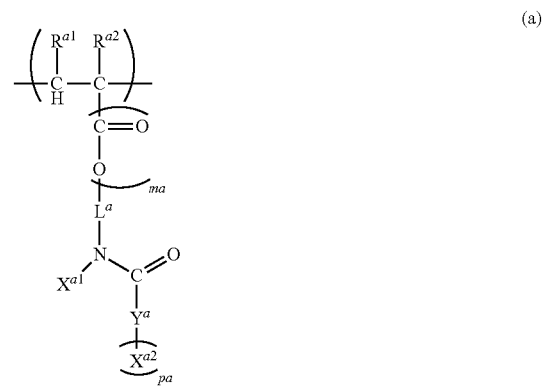

(wherein,
$R^{a1}$ and $R^{a2}$ are each independently H, $C_{1-5}$ alkyl, $C_{1-5}$ alkoxy or —COOH,
$L^a$ is a single bond, $C_{1-5}$ alkylene, —O— or $C_{1-5}$ alkoxylene,
ma is 0 to 1,
$X^{a1}$ is H or a $C_{1-5}$ hydrocarbon group (one or more of —$CH_2$— in the $C_{1-5}$ hydrocarbon group can be each independently replaced with —NH—, —C(=O)— and/or —O— and one or more of —$CH_3$ in the $C_{1-5}$ hydrocarbon group can be each independently replaced with —$NH_2$ and/or —COOH),
$Y^a$ is N or O, where when $Y^a$ is N, pa is an integer of 1 or 2, and when $Y^a$ is O, pa is 1,
$X^{a2}$ is H or a $C_{1-5}$ hydrocarbon group (one or more of —$CH_2$— in the $C_{1-5}$ hydrocarbon group can be each independently replaced with —NH—, —C(=O)— and/or —O— and one or more of —$CH_3$ in the $C_{1-5}$ hydrocarbon group can be each independently replaced with —$NH_2$ and/or —COOH), and when pa is 2, two $X^{a2}$ can be identical or different, where, $X^{a1}$ and $X^{a2}$ can be bonded and/or two $X^{a2}$ can be bonded when pa is 2, to form a saturated or unsaturated ring);

Unit (b) represented by the formula (b):

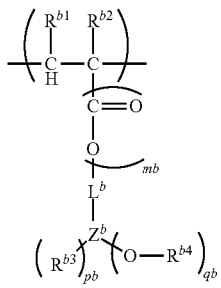

(b)

(wherein,
$R^{b1}$ and $R^{b2}$ are each independently H, $C_{1-5}$ alkyl, $C_{1-5}$ alkoxy, $C_{1-5}$ alkoxyalkyl or —COOH,
mb is 0 to 1,
$L^b$ is a single bond, $C_{1-5}$ alkylene, $C_{6-20}$ arylene, —O— or $C_{1-5}$ alkoxylene,
$Z^b$ is a $C_{6-20}$ aromatic hydrocarbon or a $C_{7-20}$ aromatic substituted aliphatic hydrocarbon,
pb is 0 to 4,
qb is 1 to 3,
$R^{b3}$ is H, $C_{1-5}$ alkyl, $C_{1-5}$ alkoxy, $C_{1-5}$ alkoxyalkyl or —COOH, and when pb>1, each $R^{b3}$ can be identical or different,
$R^{b4}$ is H or methyl, and when qb>1, each $R^{b4}$ can be identical or different,
where, Unit (b) has an aryl having at least one fused structure);

Unit (c) represented by the formula (c):

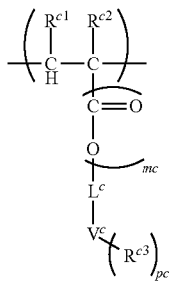

(c)

(wherein,
$R^{c1}$ and $R^{c2}$ are each independently H, $C_{1-5}$ alkyl, $C_{1-5}$ alkoxy or —COOH,
mc is 0 to 1,
$L^c$ is a single bond, $C_{1-5}$ alkylene, —O— or $C_{1-5}$ alkoxylene,
$V^c$ is a fused aromatic hydrocarbon or a fused heterocyclic ring, and $V^c$ has 3 to 6 rings fused,
pc is 0 to 5,
$R^{c3}$ is $C_{1-5}$ alkyl, $C_{1-5}$ alkoxy or —COOH, and when pc>1,
each $R^{c3}$ can be identical or different); and Unit (d) represented by the formula (d):

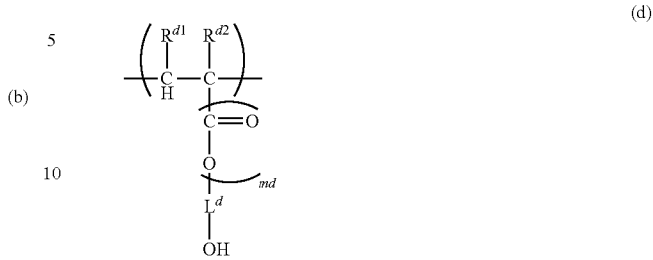

(d)

(wherein,
$R^{d1}$ and $R^{d2}$ are each independently H, $C_{1-5}$ alkyl, $C_{1-5}$ alkoxy or —COOH,
md is 0 to 1,
$L^d$ is a single bond, $C_{1-5}$ alkylene (one or more of —CH$_2$— in the $C_{1-5}$ alkylene can be replaced with —NH—, —C(=O)— and/or —O— and one or more of —CH$_3$ in the $C_{1-5}$ alkylene can be replaced with —OH, —NH$_2$ and/or —COOH), —O— or $C_{1-5}$ alkoxylene),
wherein, $n_a$, $n_b$, $n_c$ and $n_d$, which are the numbers of repetition respectively of Units (a), (b), (c) and (d), satisfy the following formulae:

$n_a+n_b>0$, $n_c \geq 0$, and $n_d \geq 0$.

The semiconductor composition according to the present invention comprises the above-mentioned polymer (A) and a solvent (B).

The method for manufacturing a film according to the present invention comprises the following processes:
(1) applying the semiconductor composition according to the present invention above a substrate; and
(2) heating said semiconductor composition to form a film.

The method for manufacturing a device according to the present invention comprises the method described above.

Effects of the Invention

It is possible to reduce sublimates. It is possible to control the etching resistance. It is possible to obtain a composition having good coating properties. It is possible to satisfactorily filled the composition into complicated and fine substrates (for example, substrates having level difference). It is possible to form a film at low temperature. It is possible to obtain a film having large absorbance. It is possible to obtain a film having suitable refractive index. It is possible to reduce standing wave. It is possible to reduce intermixing with other composition (for example, resist composition) and film. It is possible to improve flatness of upper surface of the formed film. It is possible to obtain a composition having high solubility of solute. It is possible to obtain a composition having high storage stability. It is possible to form a resist pattern having a good shape with high yield. It is possible to form a resist pattern having low LWR.

DETAILED DESCRIPTION OF THE INVENTION

Mode for Carrying Out the Invention

In the present specification, unless otherwise specifically mentioned, the singular includes the plural and "one" or "that" means "at least one". In the present specification, unless otherwise specifically mentioned, an element of a concept can be expressed by a plurality of species, and when the amount (for example, % by mass or mol %) is described, it means sum of the plurality of species.

"And/or" includes a combination of all elements and also includes single use of the element.

In the present specification, when a numerical range is indicated using "to" or "-", unless otherwise specifically mentioned, it includes both endpoints and units thereof are common. For example, 5 to 25 mol % means 5 mol % or more and 25 mol % or less.

In the present specification, the descriptions such as "$C_{x-y}$", "$C_x$-$C_y$" and "$C_x$" mean the number of carbons in a molecule or substituent. For example, $C_{1-6}$ alkyl means an alkyl chain having 1 or more and 6 or less carbons (methyl, ethyl, propyl, butyl, pentyl, hexyl etc.).

In the present specification, when a polymer has plural types of repeating unit, these repeating units copolymerize. Unless otherwise specifically mentioned, these copolymerizations are any of alternating copolymerization, random copolymerization, block copolymerization, graft copolymerization, or a mixture thereof. When polymer or resin is represented by a structural formula, n, m or the like attached next to parentheses indicate the numbers of repetition.

In the present specification, unless otherwise specifically mentioned, Celsius is used as the temperature unit. For example, 20 degrees means 20 degrees Celsius.

(A) Polymer

The polymer (A) according to the present invention comprises at least one of structural unit selected from the group consisting of Unit (a), Unit (b), Unit (c) and Unit (d) described below, wherein na, nb, nc and nd, which are the numbers of repetition respectively of Units (a), (b), (c) and (d), satisfy the following formulae:

$n_a + n_b > 0$, $n_c \geq 0$, and $n_d \geq 0$;

and preferably $n_a > 0$.

Unit (a) is represented by the formula (a).

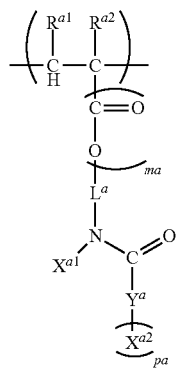

(a)

wherein,
$R^{a1}$ and $R^{a2}$ are each independently H, $C_{1-5}$ alkyl, $C_{1-5}$ alkoxy or —COOH,
$L^a$ is a single bond, $C_{1-5}$ alkylene, —O— or $C_{1-5}$ alkoxylene,
ma is 0 to 1, $X^{a1}$ is H or a $C_{1-5}$ hydrocarbon group (one or more of —CH$_2$— in the $C_{1-5}$ hydrocarbon group can be each independently replaced with —NH—, —C(=O)— and/or —O— and one or more of —CH$_3$ in the $C_{1-5}$ hydrocarbon group can be each independently replaced with —NH$_2$ and/or —COOH),
$Y^a$ is N or O, where when $Y^a$ is N, pa is an integer of 1 or 2, and when $Y^a$ is O, pa is 1, and
$X^{a2}$ is H or a $C_{1-5}$ hydrocarbon group (one or more of —CH$_2$— in the $C_{1-5}$ hydrocarbon group can be each independently replaced with —NH—, —C(=O)— and/or —O— and one or more of —CH$_3$ in the $C_{1-5}$ hydrocarbon group can be each independently replaced with —NH$_2$ and/or —COOH), and
when pa is 2, two $X^{a2}$ can be identical or different,
where, $X^{a1}$ and $X^{a2}$ can be bonded and/or two $X^{a2}$ can be bonded when pa is 2, to form a saturated or unsaturated ring.

Unit (a) to be introduced as a pendant is considered crosslinkable itself. Thereby, when a film is formed using the composition comprising the polymer (A), a crosslinked polymer can be formed even if it comprises no crosslinker.

$R^{a1}$ is preferably H, methyl, ethyl, t-butyl or methoxy, more preferably H or methyl, and further preferably H.

$R^{a2}$ is preferably H, methyl, ethyl, t-butyl or methoxy, more preferably H or methyl, and further preferably methyl.

$L^a$ is preferably a single bond, methylene, ethylene, propylene, —O— or methoxylene, more preferably methylene or ethylene, and further preferably methylene.

ma is preferably 0 or 1, and more preferably 1. It is possible that the polymer (A) has plural types of Unit (a), but in such a case, a non-integer number such as ma=0.5 can be taken. Hereinafter, the same applies to the numbers in the formula relating to polymer unless otherwise specified as integers.

$Y^a$ is preferably N, and pa is preferably 2. In other aspect, $Y^a$ is N and pa is 1. In this case, N and $X^{a2}$ are bonded by a double bond (—N=$X^{a2}$).

The $C_{1-5}$ hydrocarbon group of $X^{a1}$ can be linear or branched. $X^{a1}$ is preferably H, methyl, ethyl or propyl, and more preferably H.

The $C_{1-5}$ hydrocarbon group of $X^{a2}$ can be each independently linear or branched. Preferably, $X^{a2}$ is each independently a $C_{1-5}$ hydrocarbon group (one or more of —CH$_2$— in the $C_{1-5}$ hydrocarbon group can be each independently replaced with —NH— and one or more of —CH$_3$ in the $C_{1-5}$ hydrocarbon group can be each independently replaced with —NH$_2$).

Preferably, the formula (a) is represented by the following formula (a-1).

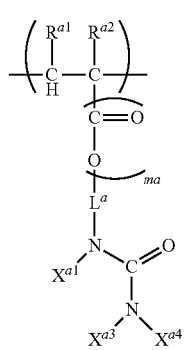

(a-1)

wherein,

R$^{a1}$, R$^{a2}$, L$^{a}$, ma and X$^{a1}$ are as described above, and X$^{a3}$ and X$^{a4}$ are each independently H or a C$_{1-5}$ hydrocarbon group (one or more of —CH$_2$— in the C$_{1-5}$ hydrocarbon group can be each independently replaced with —NH—, —C(=O)— and/or —O— and one or more of —CH$_3$ in the C$_{1-5}$ hydrocarbon group can be each independently replaced with —NH$_2$ and/or —COOH), where, X$^{a1}$ and X$^{a3}$ or X$^{a4}$ can be bonded and/or X$^{a3}$ and X$^{a4}$ can be bonded, to form a saturated or unsaturated ring. The C$_{1-5}$ hydrocarbon group of X$^{a3}$ and X$^{a4}$ can be each independently linear or branched. Preferably, X$^{a3}$ and X$^{a4}$ are each independently a C$_{1-5}$ hydrocarbon group (one or more of —CH$_2$— in the C$_{1-5}$ hydrocarbon group can be each independently replaced with —NH— and one or more of —CH$_3$ in the C$_{1-5}$ hydrocarbon group can be each independently replaced with —NH$_2$).

Preferably, X$^{a1}$ and X$^{a3}$ or X$^{a4}$ form no ring. When X$^{a3}$ and X$^{a4}$ form a ring, it is preferably a 5- to 7-membered ring, wherein one or two atoms constituting the ring are nitrogen atoms and the remaining atoms are carbon atoms.

When X$^{a3}$ and X$^{a4}$ form no ring, X$^{a3}$ and X$^{a4}$ are each independently H, methyl or ethyl, and more preferably H or methyl. In one preferred embodiment, any one of X$^{a3}$ and X$^{a4}$ is methyl.

Exemplified embodiments of the formula (a-1) are, for example, as shown below.

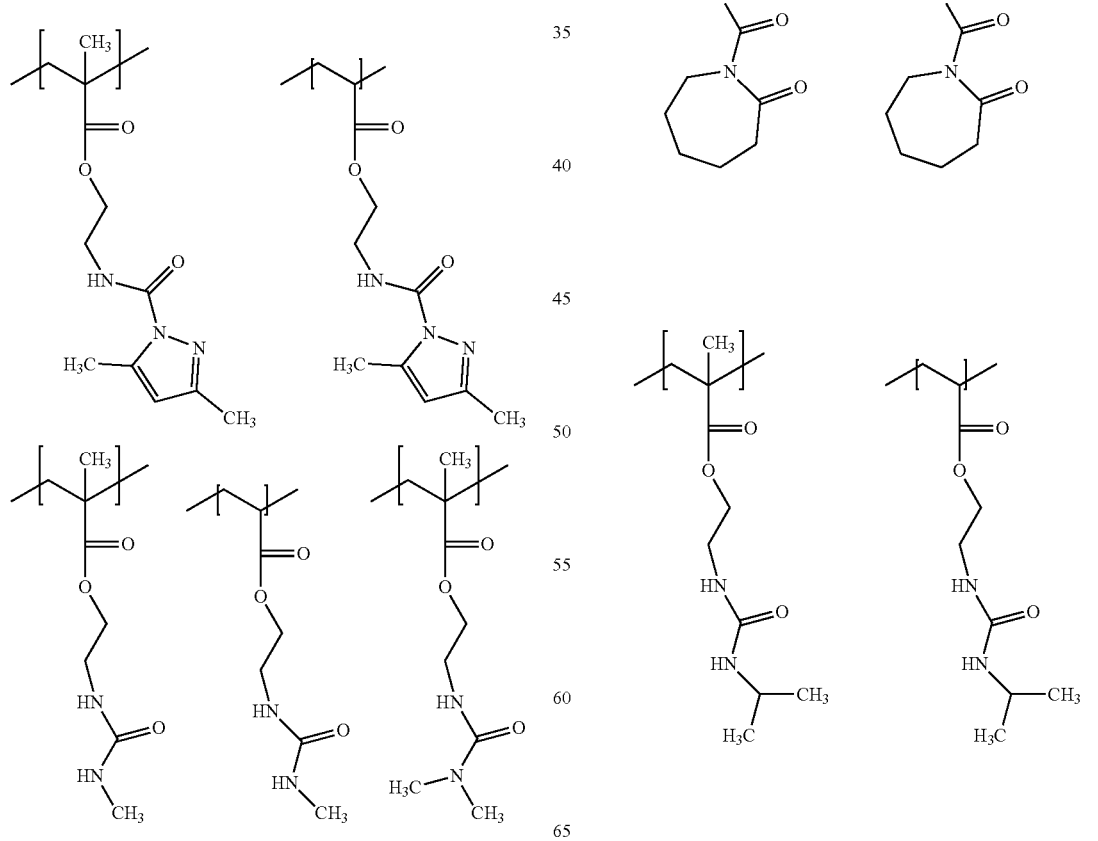

Further, the formula (a) can also be a case represented by the formula (a-2).

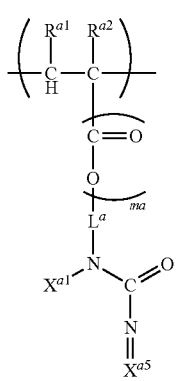

(a-2)

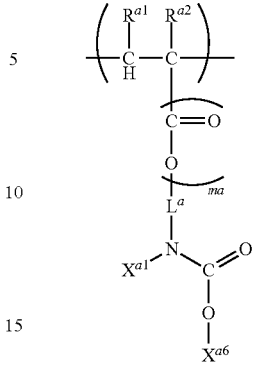

(a-3)

wherein, $R^{a1}$, $R^{a2}$, $L^a$, ma and $X^{a1}$ are as described above, and $X^{a5}$ is a $C_{1-5}$ hydrocarbon group (one or more of —$CH_2$— in the $C_{1-5}$ hydrocarbon group can be each independently replaced with —NH—, —C(=O)— and/or —O— and one or more of —$CH_3$ in the $C_{1-5}$ hydrocarbon group can be each independently replaced with —$NH_2$ and/or —COOH), where, $X^{a1}$ and $X^{a5}$ can be bonded to form a saturated or unsaturated ring. Preferably, $X^{a1}$ and $X^{a5}$ form no ring. The $C_{1-5}$ hydrocarbon group of $X^{a5}$ can be linear or branched and is preferably branched. Preferably, $X^{a5}$ is a $C_{1-4}$ hydrocarbon group, where —$CH_2$— in the $C_{1-4}$ hydrocarbon group can be replaced with neither —NH—, —C(=O)— nor —O— and —$CH_3$ in the $C_{1-4}$ hydrocarbon group can be replaced with neither —$NH_2$ nor —COOH.

Exemplified embodiments of the formula (a-2) are, for example, as shown below.

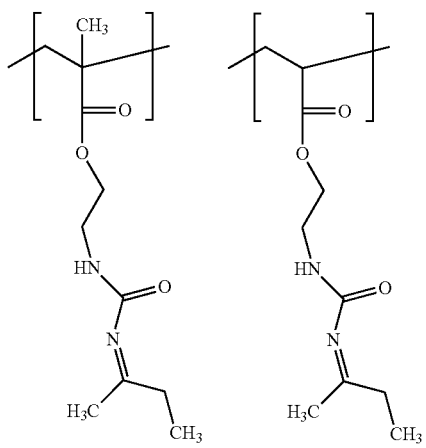

Further, the formula (a) can also be a case represented by the formula (a-3).

wherein, $R^{a1}$, $R^{a2}$, $L^a$, ma and $X^{a1}$ are as described above, and $X^{a6}$ is a $C_{1-5}$ hydrocarbon group (one or more of —$CH_2$— in the $C_{1-5}$ hydrocarbon group can be each independently replaced with —NH—, —C(=O)— and/or —O— and one or more of —$CH_3$ in the $C_{1-5}$ hydrocarbon group can be each independently replaced with —$NH_2$ and/or —COOH), where, $X^{a1}$ and $X^{a6}$ can be bonded to form a saturated ring or an unsaturated ring.

$X^{a6}$ is preferably methyl, ethyl, n-propyl, isopropyl and t-butyl, and more preferably methyl and n-propyl.

Exemplified embodiments of the formula (a-3) are, for example, as shown below.

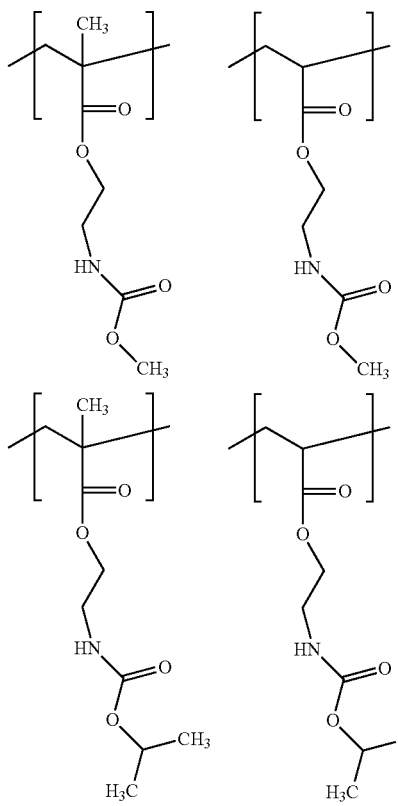

Unit (b) is represented by the formula (b).

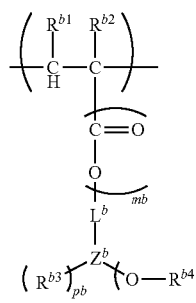

wherein, $R^{b1}$ and $R^{b2}$ are each independently H, $C_{1-5}$ alkyl, $C_{1-5}$ alkoxy, $C_{1-5}$ alkoxyalkyl or —COOH, mb is 0 to 1, $L^b$ is a single bond, $C_{1-5}$ alkylene, $C_{6-20}$ arylene, —O— or $C_{1-5}$ alkoxylene, $Z^b$ is a $C_{6-20}$ aromatic hydrocarbon or a $C_{7-20}$ aromatic substituted aliphatic hydrocarbon, pb is 0 to 4, qb is 1 to 3, $R^{b3}$ is H, $C_{1-5}$ alkyl, $C_{1-5}$ alkoxy, $C_{1-5}$ alkoxyalkyl or —COOH, and when pb>1, each $R^{b3}$ can be identical or different, and $R^{b4}$ is H or methyl, and when qb>1, each $R^{b4}$ can be identical or different, where, Unit (b) has an aryl having at least one fused structure. It can also be said that Unit (b) comprises at least one fused cyclic hydrocarbon. Such a fused cyclic hydrocarbon is preferably naphthyl or anthracene.

$R^{b1}$ is preferably H, methyl, ethyl or t-butyl, and more preferably H.

$R^{b2}$ is preferably H, methyl, ethyl or t-butyl, more preferably H or methyl, and further preferably methyl.

mb is preferably 0 or 1, and more preferably 1.

$L^b$ is preferably a single bond, methylene, ethylene, propylene, naphthylene, anthracenylene, —O—, methoxylene or ethoxylene, more preferably a single bond, methylene or naphthylene, further preferably a single bond or naphthylene, and still more preferably a single bond.

$R^{b3}$ is preferably H, methyl, ethyl, propyl, methoxy or methoxymethyl, more preferably H, methyl or methoxymethyl, further preferably H or methoxymethyl, and still more preferably H. pb is preferably 0 to 3, more preferably 0 to 2, further preferably 0 or 1, and still more preferably 0. When pb=0, it can also be said that $R^{b3}$ is noumenally H. In order to secure clarity, when pb=0, it can also be made $R^{b3} \neq H$.

$R^{b4}$ is preferably H. qb is preferably 1 to 2, more preferably 1 or 2, and further preferably 1.

By having Unit (b), the film formed from the polymer (A) is considered to have a suitable refractive index (n). For this reason, the polymer (A) having Unit (b) is useful for the resist underlayer forming composition and further useful for the bottom anti-reflective coating forming composition. In addition, it is also useful for top anti-reflective coating forming composition.

In addition, the following structure is an example of Unit (b). In the above formula (b), this is a case where:

$R^{b1}$ and $R^{b2}$ are H, mb is 1, $L^b$ and $Z^b$ have the following structures, respectively, Pb is 4, qb is 2, $R^{b3}$ is all —$CH_2$—O—$CH_3$, and $R^{b4}$ is all H.

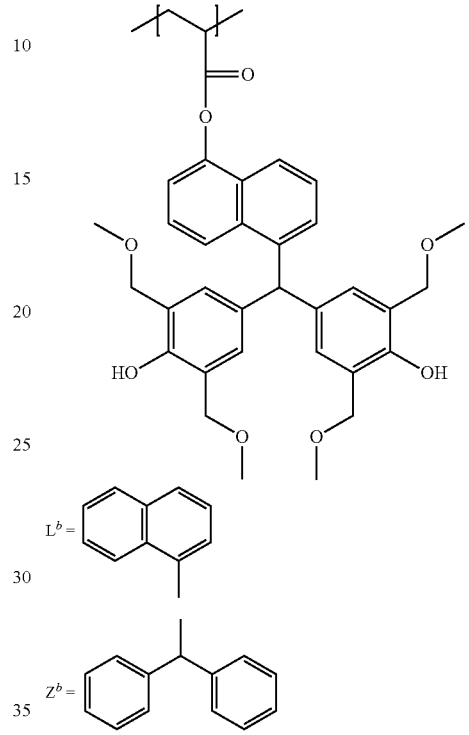

Zb is preferably a benzene ring, a naphthalene ring, an anthracene ring, a diphenylmethyl, diphenylethyl or a phenylnaphthylmethyl, and more preferably a naphthalene ring.

Unit (b) can also be represented by the following formula (b-1).

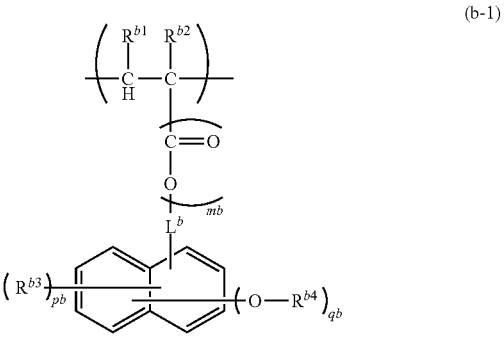

wherein, $R^{b1}$, $R^{b2}$, mb, $L^b$, pb, qb, $R^{b3}$ and $R^{b4}$ are each independently as described above.

Exemplified embodiments of the formula (b-1) are, for example, as shown below.

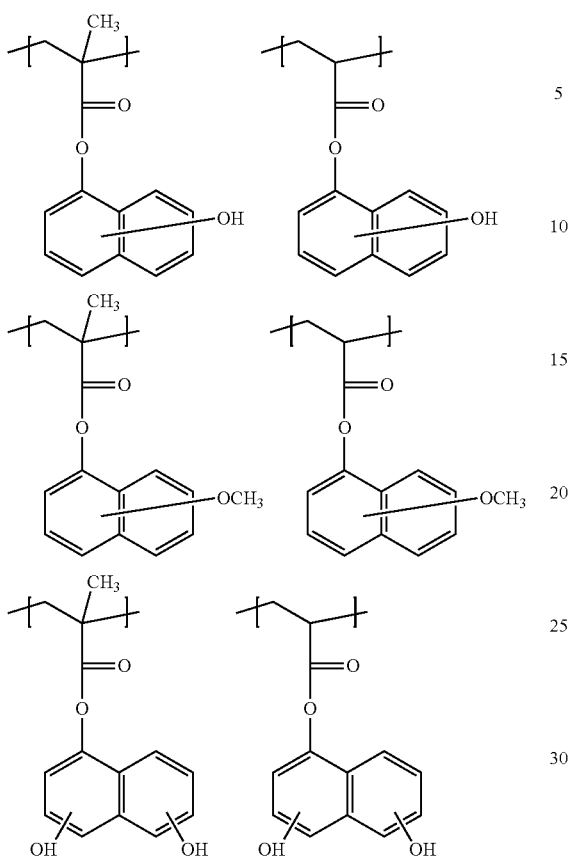

As the formula (b-1), the followings are more preferable.

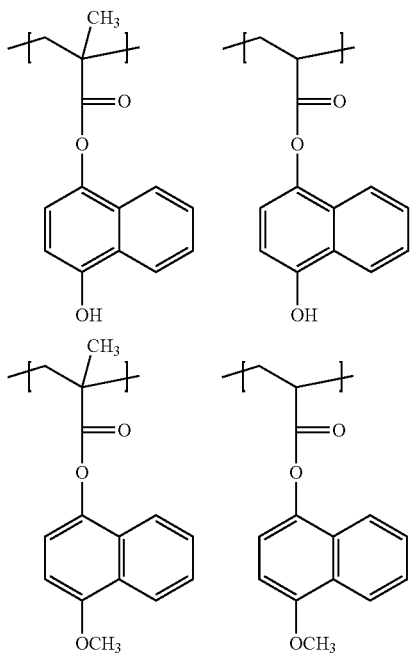

Unit (c) is represented by the formula (c).

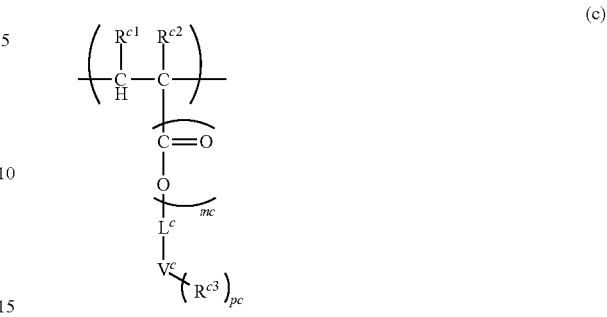

wherein, $R^{c1}$ and $R^{c2}$ are each independently H, $C_{1-5}$ alkyl, $C_{1-5}$ alkoxy or —COOH, mc is 0 to 1, $L^c$ is a single bond, $C_{1-5}$ alkylene, —O— or $C_{1-5}$ alkoxylene, $V^c$ is a fused aromatic hydrocarbon or a fused heterocyclic ring, and $V^c$ has 3 to 6 rings fused, pc is 0 to 5, and $R^{c3}$ is $C_{1-5}$ alkyl, $C_{1-5}$ alkoxy or —COOH, and when pc>1, each $R^{c3}$ can be identical or different.

$R^{c1}$ is preferably H, methyl or ethyl, and more preferably H.

$R^{c2}$ is preferably H, methyl or ethyl, more preferably H or methyl, and further preferably methyl.

$L^c$ is preferably a single bond, methylene, ethylene, propylene, —O— or methoxylene, more preferably a single bond or methylene, and further preferably methylene.

mc is preferably 0 or 1, and more preferably 1.

$R^{c3}$ is preferably H, methyl or ethyl, more preferably H or methyl, and further preferably H.

pc is preferably 0, 1, 2, 3, 4 or 5, more preferably 0, 1 or 2, further preferably 0 or 1, and still more preferably 0. When pc=0, it can also be said that $R^{c3}$ is noumenally H. In order to secure clarity, when pc=0, it can also be made $R^{c3} \neq H$.

By having Unit (c), the film formed from the polymer (A) is considered to have a suitable absorption parameter (k) and/or refractive index (n). For example, it is considered that (k) value and/or (n) value can be increased. For this reason, the polymer (A) having Unit (c) is useful for the resist underlayer forming composition and further useful for the bottom anti-reflective coating forming composition. In addition, it is also useful for top anti-reflective coating forming composition.

Vc is preferably anthracene derivatives, phenanthrene derivatives or xanthene derivatives, more preferably anthracene derivatives or phenanthrene derivatives, and further preferably anthracene derivatives.

Preferably, the formula (c) is represented by the following formula (c-1) or (c-2).

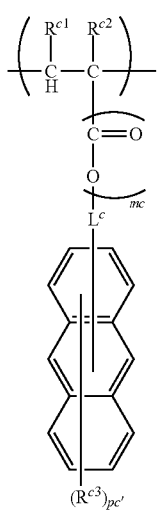

(c-1)

wherein,
$R^{c1}$, $R^{c2}$, $R^{c3}$, $L^c$ and mc are each independently as described above.

One carbon in anthracene, which falls under Vc, can be replaced with oxygen, and an aspect in which it is not replaced is more preferable.

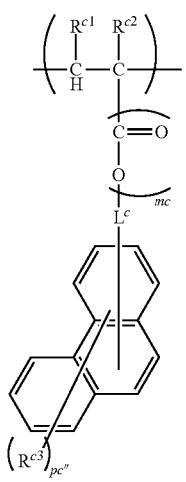

(c-2)

wherein,
$R^{c1}$, $R^{c2}$, $R^{c3}$, $L^c$ and mc are each independently as described above.

One carbon in phenanthrene can be replaced with oxygen, and an aspect in which it is not replaced is more preferable. $R^{c3}$ is $C_{1-5}$ alkyl, $C_{1-5}$ alkoxy or —COOH, and when pc" is 2, 3, 4 or 5, each $R^{c3}$ can be identical or different. Two $R^{c3}$ can form a saturated or unsaturated ring.

Exemplified embodiments of the formula (c-1) are, for example, as shown below.

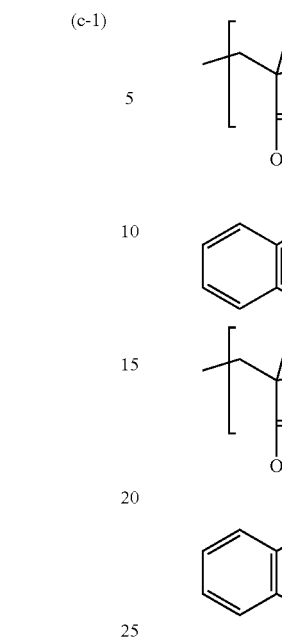

Exemplified embodiments of the formula (c-2) are, for example, as shown below.

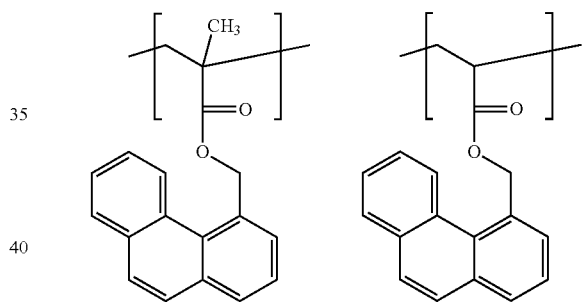

Exemplified embodiments of formula (c) other than the above exemplified embodiments are, for example, as shown below.

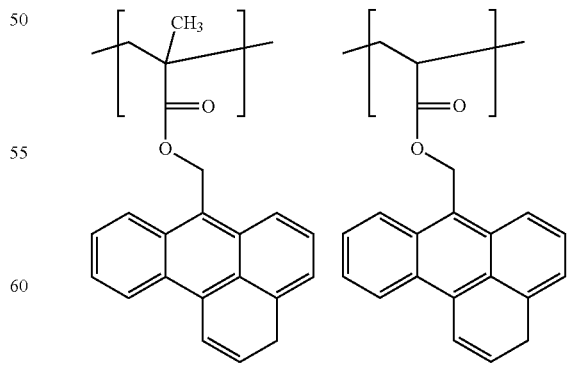

-continued

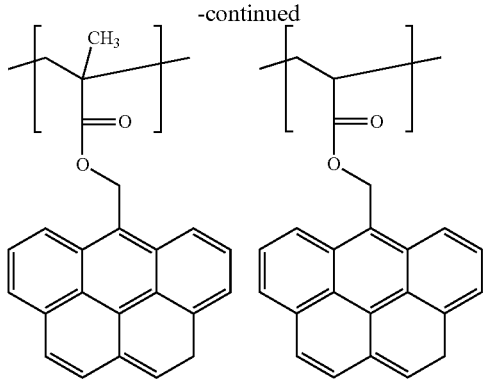

Unit (d) is represented by the formula (d).

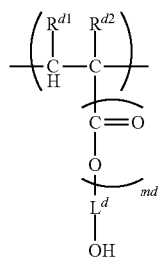

(d)

wherein,
$R^{d1}$ and $R^{d2}$ are each independently H, $C_{1-5}$ alkyl, $C_{1-5}$ alkoxy or —COOH,
md is 0 to 1, and
$L^d$ is a single bond, $C_{1-5}$ alkylene (one or more of —$CH_2$— in the $C_{1-5}$ alkylene can be replaced with —NH—, —C(=O)— and/or —O— and one or more of —$CH_3$ in the $C_{1-5}$ alkylene can be replaced with —OH, —$NH_2$ and/or —COOH), —O— or $C_{1-5}$ alkoxylene.

$R^{d1}$ is preferably H, methyl, ethyl, t-butyl or methoxy, more preferably H or methyl, and further preferably H.

$R^{d2}$ is preferably H, methyl, ethyl, t-butyl or methoxy, more preferably H or methyl, and further preferably methyl.

md is preferably 0 or 1, and more preferably 1.

$L^d$ is preferably $C_{1-5}$ alkylene (one or more of —$CH_2$ in the $C_{1-5}$ alkylene can be replaced with —C(=O)— and one or more of —$CH_3$ in the $C_{1-5}$ alkylene can be replaced with —OH and/or —COOH), more preferably $C_{1-4}$ alkylene (one or more of —$CH_2$ in the $C_{1-4}$ alkylene is —C(=O) and one or more of —$CH_3$ in the $C_{1-4}$ alkylene can be replaced with —OH and/or —COOH), and further preferably $C_{1-4}$ alkylene (one —CH2- in the $C_{1-4}$ alkylene can be replaced with —C(=O)— and one —$CH_3$ in the $C_{1-4}$ alkylene can be replaced with —OH and/or —COOH).

By having Unit (d), the film formed from the polymer (A) is considered to have a suitable absorption parameter (k), refractive index (n) and/or a fast etching rate. Further, the unit (d) can also function as a crosslinking site during film formation and can contribute to film formation and crosslinkability. For this reason, the polymer (A) having Unit (d) is useful for the resist underlayer forming composition and further useful for the bottom anti-reflective coating forming composition. In addition, it is also useful for top anti-reflective coating forming composition.

Exemplified embodiments of the formula (d) are, for example, as shown below.

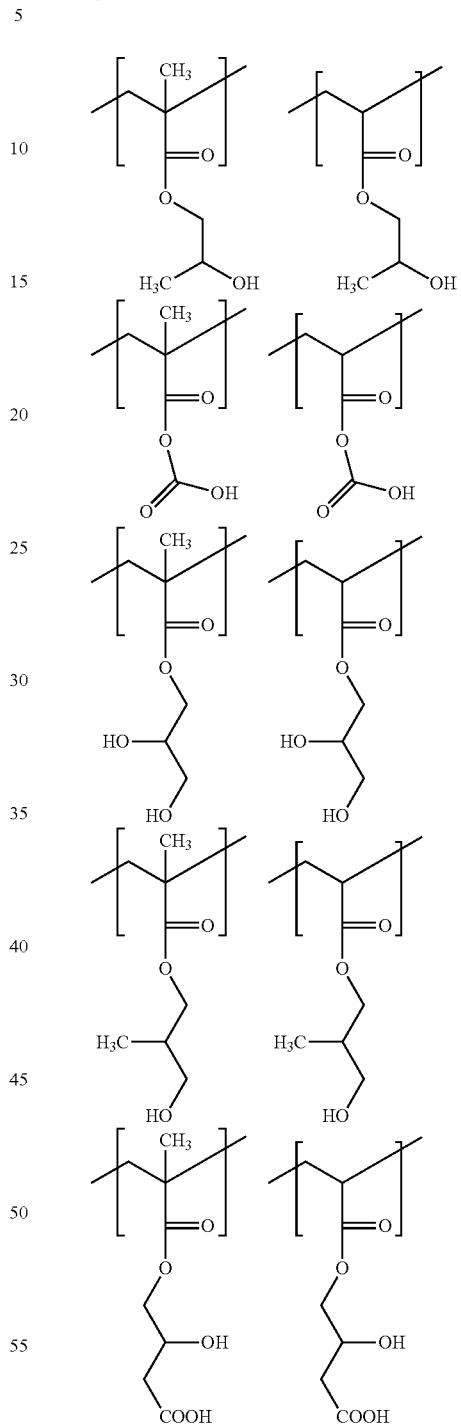

In the polymer (A), $n_a$, $n_b$, $n_c$ and $n_d$, which are the numbers of repetition respectively of Units (a), (b), (c) and (d), satisfy the following formulae:

$n_a + n_b > 0$, $n_c \geq 0$, and $n_d \geq 0$.

$n_a/(n_a+n_b+n_c+n_d)$ is preferably 2 to 80%, more preferably 5 to 50%, further preferably 10 to 50%, and still more preferably 20 to 40%.

$n_b/(n_a+n_b+n_c+n_d)$ is preferably 10 to 90%, more preferably 20 to 80%, further preferably 30 to 80%, and still more preferably 25 to 60%.

$n_c/(n_a+n_b+n_c+n_d)$ is preferably 3 to 80%, more preferably 5 to 40%, further preferably 5 to 50%, and still more preferably 8 to 20%.

$n_d/(n_a+n_b+n_c+n_d)$ is preferably 0 to 80%, more preferably 0 to 40%, further preferably 5 to 30%, and still more preferably 10 to 30%.

Preferably, these satisfy the following formulae:

$$5\% \leq n_a/(n_a+n_b+n_c+n_d) \leq 50\%,$$

$$30\% \leq n_b/(n_a+n_b+n_c+n_d) \leq 80\%,$$

$$5\% \leq n_c/(n_a+n_b+n_c+n_d) \leq 40\%, \text{ and/or}$$

$$0\% \leq n_d/(n_a+n_b+n_c+n_d) \leq 40\%.$$

Preferably, the total number ($n_{total}$) of all repeating units contained in the polymer (A) satisfies the following formula:

$$80\% \leq (n_a+n_b+n_c+n_d)/n_{total} \leq 100\%.$$

More preferably, it satisfies the following formula:

$$90\% \leq (n_a+n_b+n_c+n_d)/n_{total} \leq 100\%.$$

Further preferably, it satisfies the following formula:

$$95\% \leq (n_a+n_b+n_c+n_d)/n_{total} \leq 100\%.$$

It is also a preferable aspect of the present invention that being $(n_a+n_b+n_c+n_d)/n_{total}=100\%$, that is, no repeating unit other than $n_a$, $n_b$, $n_c$ and $n_d$ is contained.

The mass average molecular weight (hereinafter sometimes referred to as Mw) of the polymer (A) is preferably 1,000 to 50,000, more preferably 3,000 to 40,000, and further preferably 5,000 to 20,000.

The number average molecular weight (hereinafter sometimes referred to as Mn) of the polymer (A) is preferably 1,000 to 50,000, and more preferably 5,000 to 10,000.

In the present invention, Mw and Mn can be measured by gel permeation chromatography (GPC). In the measurement, it is a suitable example to use a GPC column at 40 degrees Celsius, an elution solvent tetrahydrofuran at 0.6 mL/min and monodisperse polystyrene as a standard.

The method for synthesizing the polymer (A) according to the present invention is not particularly limited, but Exemplified embodiments are shown in the synthesis examples described later. It is also possible to combine known synthesis methods with the synthesis examples.

<Semiconductor Composition>

The semiconductor composition according to the present invention (hereinafter sometimes referred to as the composition) comprises a polymer (A) and a solvent (B).

Here, in the present invention, the semiconductor composition means a composition to be used in a semiconductor manufacturing process, and more preferably to be used in a lithography process. The semiconductor composition according to the present invention is preferably a composition for manufacturing semiconductor. The semiconductor composition according to the present invention can be one that is removed in the semiconductor manufacturing process not to finally remain in the semiconductor. The semiconductor composition is preferably a resist underlayer composition, more preferably a bottom anti-reflective coating composition. Here, the resist underlayer and the bottom anti-reflective coating are formed above a substrate and below a resist film. The resist underlayer and the bottom anti-reflective coating can be formed in contact with the substrate or the resist film, or can be formed through an interlayer.

The content of the polymer (A) is preferably 1 to 30% by mass, and more preferably 1 to 15% by mass, based on the total mass of the composition.

(B) Solvent

The solvent used in the composition according to the present invention preferably comprises water, a hydrocarbon solvent, an ether solvent, an ester solvent, an alcohol solvent or a ketone solvent.

Exemplified embodiments of the solvent include water, n-pentane, i-pentane, n-hexane, i-hexane, n-heptane, i-heptane, 2,2,4-trimethylpentane, n-octane, i-octane, cyclohexane, methylcyclohexane, benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amyl naphthalene, trimethyl benzene, methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethyl nonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethyl carbinol, diacetone alcohol, cresol, ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, glycerin, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonane, cyclohexanone, cyclopentanone, methylcyclohexanone, 2,4-pentanedione, acetonylacetone, diacetone alcohol, acetophenone, fenthion, ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether (PGME), propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methyl cyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate (EL), γ-butyrolactone, n-butyl lactate, n-amyl lactate, diethyl malonate, dimethyl phthalate, diethyl phthalate, propylene glycol 1-monomethyl ether 2-acetate (PGMEA), propylene glycol monoethyl ether acetate and propylene glycol monopropyl ether acetate; N-methylformamide, N,N-dimethylformamide, N,N-diethylformamide, acetamide, N-methylacetamide, N,N-dimethylacetamide, N-methylpropionamide, N-methyl pyrrolidone, dimethyl sulfide, diethyl sulfide, thiophene, tetrahydrothiophene, dimethyl sulfoxide, sulfolane, and 1,3-propane sultone. These solvents can be used alone or in combination of two or more.

The solvent (B) is more preferably PGMEA, PGME or a mixture thereof.

It is one aspect that the solvent (B) contains no water in relation to other layers or films. For example, the amount of water in the entire solvent (B) is preferably 0.1% by mass or less, more preferably 0.01% by mass or less, and further preferably 0.001% by mass or less.

The content of the solvent (B) is preferably 50 to 99% by mass, more preferably 70 to 98% by mass, and further preferably 80 to 95% by mass based on the total mass of the semiconductor composition. The film thickness after film formation can be controlled by increasing or decreasing the amount of the solvent in the entire composition.

(C) Crosslinker

The composition according to the present invention can further comprise a crosslinker. In addition, in the present invention, the crosslinker means a compound itself having a crosslinking function. The compound having a crosslinking function is sometimes dissolved or dispersed in a solvent and contained in the composition. Such a solvent is preferably contained in the semiconductor composition as the solvent (B) or other component.

The crosslinker is useful to increase film formability when forming a film of the composition, to prevent the film from being intermixed with a film (for example, resist film) to be formed on its upper layer, and to eliminate diffusion of low molecular components into the upper layer film. As is described later in Examples, among the polymer (A) according to the present invention, there are those good in film formation, filling properties and crosslinkability even without containing any crosslinker. Further, it is possible to suppress sublimate (outgas) during film formation, which is useful for avoiding contamination of the apparatus. For this reason, as one aspect of the present invention, it is preferable that the content of the crosslinker to be added is less. Therefore, the content of the crosslinker is preferably 0 to 5% by mass, more preferably 0 to 1% by mass, and further preferably 0% by mass, based on the total mass of the polymer (A). The content of the crosslinker can be reduced by introducing a structure, which is capable of crosslinking, in the structure of the polymer (A).

As the crosslinker, melamine compounds, guanamine compounds, glycoluril compounds or urea compounds substituted by at least one group selected from a methylol group, an alkoxymethyl group, and an acyloxymethyl group; epoxy compounds; thioepoxy compounds; isocyanate compounds; azide compounds; and compounds comprising a double bond such as an alkenyl ether group can be referred. Further, compounds comprising a hydroxy group can also be used as the crosslinker.

As the epoxy compounds, tris(2,3-epoxypropyl)isocyanurate, trimethylolmethane triglycidyl ether, trimethylolpropane triglycidyl ether, and triethylolethane triglycidyl ether can be referred. As the melamine compounds, hexamethylolmelamine, hexamethoxymethylmelamine, compounds derived by methoxymethylation of 1 to 6 methylol groups of hexamethylolmelamine and mixtures thereof, hexamethoxyethylmelamine, hexaacyloxymethylmelamine, compounds derived by acyloxymethylation of 1 to 6 methylol groups of hexamethylolmelamine or mixtures thereof can be referred. As the guanamine compounds, tetramethylolguanamine, tetramethoxymethylguanamine, compounds derived by methoxymethylation of 1 to 4 methylol groups of tetramethylolguanamine and mixtures thereof, tetramethoxyethylguanamine, tetraacyloxyguanamine, compounds derived by acyloxymethylation of 1 to 4 methylol groups of tetramethylolguanamine and mixtures thereof can be referred. As the glycoluril compounds, tetramethylolglycoluril, tetramethoxyglycoluril, tetramethoxymethylglycoluril, compounds derived by methoxymethylation of 1 to 4 methylol groups of tetramethylolglycoluril or mixtures thereof, compounds derived by acyloxymethylation of 1 to 4 methylol groups of tetramethylolglycoluril or mixtures thereof can be referred. As the urea compounds, tetramethylolurea, tetramethoxymethylurea, compounds derived by methoxymethylation of 1 to 4 of methylol groups of tetramethylolurea or mixtures thereof, tetramethoxyethylurea, and the like can be referred. As the compounds containing an alkenyl ether group, ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, trimethylolpropane trivinyl ether, and the like can be referred.

As the other crosslinker, those represented by the following formula can be referred.

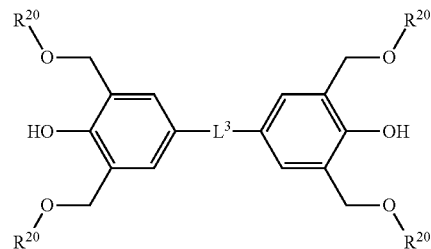

wherein,
L³ is a direct bond, substituted or unsubstituted $C_{1-3}$ alkyl, and $R^{20}$ is hydrogen or methyl. $L^3$ is preferably a direct bond or methyl, and more preferably a direct bond. The substituent of the $C_{1-3}$ alkyl is preferably hydrogen, methyl, $C_{6-10}$ aryl, or any one of the following two formulae, and more preferably methyl or any one of the following two formulae.

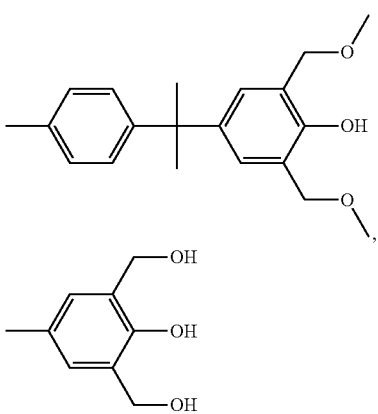

Exemplified embodiments of the crosslinker represented by the above formula are as shown below, but the scope of the present invention is not limited thereto.

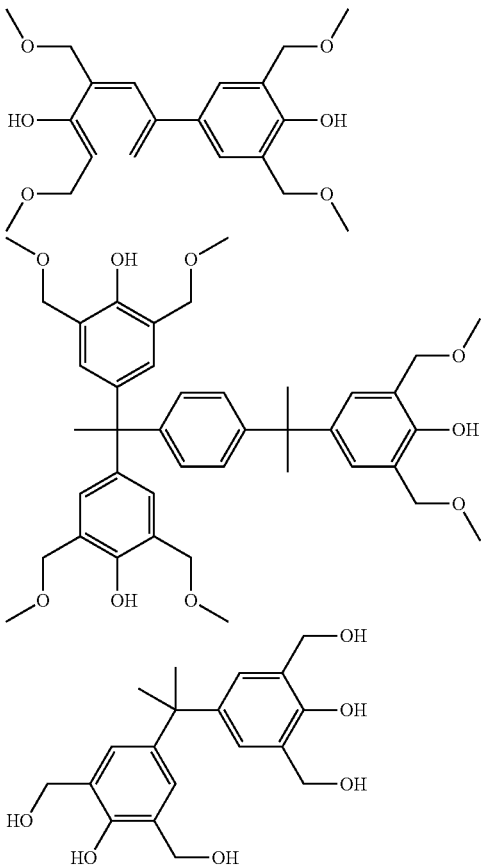

The crosslinking temperature for film formation of the present composition is preferably 50 to 230° C., more preferably 80 to 220° C., and further preferably 80 to 190° C.

(D) Acid Generator

The composition according to the present invention can further comprise an acid generator. In addition, in the present invention, the acid generator means a compound itself having an acid generating function. The compound having an acid generating function is sometimes dissolved or dispersed in a solvent and contained in the composition. Such a solvent is preferably contained in the semiconductor composition as the solvent (B) or other component.

The content of the acid generator (D) is preferably 0.01 to 10% by mass, and more preferably 1 to 7% by mass, based on the total mass of the polymer (A).

As the acid generator, a thermal acid generator (TAG) capable of generating a strong acid by heating can be used. The acid generator to be used in the present invention is preferably a compound that generates by heating an acid capable of reacting with the polymer (A) according to the present invention and of propagating crosslinking of the polymer. In a preferred embodiment, the acid to be generated is a strong acid such as sulfonic acid.

Preferably, the thermal acid generator is activated at a temperature exceeding 80° C. Examples of the thermal acid generator include metal-free sulfonium salts and metal-free iodonium salts, for example, triarylsulfonium, dialkylarylsulfonium and diarylalkylsulfonium salts of strong non-nucleophilic acids, and alkylaryliodonium and diaryliodonium salts of strong non-nucleophilic acids; and ammonium, alkylammonium, dialkylammonium, trialkylammonium, and tetraalkylammonium salts of strong non-nucleophilic acids. Further, covalent thermal acid generators are also considered as useful additives, and examples thereof include 2-nitrobenzyl esters of alkyl or aryl sulfonic acids and other sulfonic acid esters which are thermally decomposed to give free sulfonic acid. Examples thereof include diaryliodonium perfluoroalkyl sulfonates, diaryliodonium tris(fluoroalkylsulfonyl)methides, diaryliodonium bis(fluoroalkylsulfonyl)methides, diaryliodonium bis(fluoroalkylsulfonyl)imides, and diaryliodonium quaternary ammonium perfluoroalkyl sulfonates. Examples of the labile ester include 2-nitrobenzyl tosylate, 2,4-dinitrobenzyl tosylate, 2,6-dinitrobenzyl tosylate, and 4-nitrobenzyl tosylate; benzenesulfonates such as 2-trifluoromethyl-6-nitrobenzyl 4-chlorobenzenesulfonate and 2-trifluoromethyl-6-nitrobenzyl 4-nitrobenzenesulfonate; phenolic sulfonate esters such as phenyl 4-methoxybenzenesulfonate; quaternary ammonium tris(fluoroalkylsulfonyl)methides, quaternary alkylammonium bis(fluoroalkylsulfonyl)imides, and alkylammonium salts of organic acids such as triethylammonium salt of 10-camphorsulfonic acid. Various aromatic (anthracene, naphthalene or benzene derivative) sulfonic acid amine salts, including those disclosed in U.S. Pat. Nos. 3,474,054, 4,200,729, 4,251,665 and 5,187,019, can be used as the TAG. The acid generator to be used in the present invention can be two or more compounds.

(E) Surfactant

The composition according to the present invention can further comprise a surfactant in order to improve coating properties. Here, in the present invention, the surfactant means a compound itself having a surface active action. The compound having a surface active action is sometimes dissolved or dispersed in a solvent and contained in the composition. Such a solvent is preferably contained in the semiconductor composition as the solvent (B) or other component.

The content of the surfactant (E) is preferably 0.001 to 5% by mass, and more preferably 0.01 to 0.5% by mass, based on the total mass of the polymer (A).

As the surfactant (E) that can be used in the present invention, (I) an anionic surfactant, (II) a cationic surfactant or (III) a nonionic surfactant can be referred, and in particular, (I) alkyl sulfonate, alkylbenzene sulfonic acid and alkylbenzene sulfonate, (II) lauryl pyridinium chloride and lauryl methyl ammonium chloride, and (III) polyoxyethylene octyl ether, polyoxyethylene lauryl ether and polyoxy ethylene acetylenic glycol ether are preferred.

(F) Additive

The composition according to the present invention can comprise other additive (F) than (A) to (E).

The additive (F) is not particularly limited, but the additive is preferably at least one selected from the group consisting of a base generator, a smoothing agent, a monomeric dye, a lower alcohol ($C_{1-6}$ alcohol), a surface leveling agent, a substrate adhesion agent, an antifoaming agent and an antiseptic. As in the case of a base generator, for example, wherein it means a compound itself that generates a base, the additive means a compound itself having its function. The compound is sometimes dissolved or dispersed in a solvent and contained in the composition. Such a solvent is preferably contained in the semiconductor composition as the solvent (B) or other component.

The content of the additive (F) is preferably 0 to 10% by mass, and more preferably 0 to 5% by mass, based on the total mass of the polymer (A). It is a preferable example of the composition according to the present invention that no additive (F) is contained (0% by mass).

<Method for Manufacturing a Film>

The method for manufacturing a film according to the present invention comprises the following processes:
 (1) applying the semiconductor composition according to the present invention above a substrate; and
 (2) heating said semiconductor composition to form a film.

Here, the film according to the present invention means a film derived from the semiconductor composition according to the present invention, and is hereinafter sometimes referred to as the film (2). The film (2) is preferably a resist underlayer, and more preferably a bottom anti-reflective coating.

Hereinafter, one aspect of the manufacturing method according to the present invention is described.

The semiconductor composition according to the present invention is applied above a substrate (for example, a silicon/silicon dioxide-coated substrate, a silicon nitride substrate, a silicon wafer substrate, a glass substrate, an ITO substrate, and the like) by an appropriate method. Here, in the present invention, the "above" includes the case where a layer is formed immediately above a substrate and the case where a layer is formed above a substrate via another layer. For example, a planarization film can be formed immediately above a substrate, and the composition according to the present invention can be applied immediately above the planarization film. The application method is not particularly limited, and examples thereof include a method using a spinner or a coater. After application, the film according to the present invention is formed by heating. The heating of (2) is performed, for example, by a hot plate. The heating temperature is preferably 100 to 250° C., more preferably 125 to 225° C., and further preferably 150 to 200° C. The temperature here is a temperature of heating atmosphere, for example, that of a heating surface of a hot plate. The heating time is preferably 30 to 300 seconds, and more preferably 45 to 180 seconds. The heating is preferably performed in an air or nitrogen gas atmosphere. By this heating, crosslinking reaction proceeds in the composition. Therefore, the film (2) is not easily dissolved in the subsequent processes.

The film thickness of the film (2) is preferably 10 to 1,000 nm, more preferably 30 to 500 nm, and further preferably 50 to 100 nm.

The absorption parameter (k) of the film (2) is measured by ellipsometric measurement and is a numerical value of 0.01 to 1.0 depending on the exposure wavelength. The refractive index (n) is also optimized and can be a numerical value of 1.3 to 2.0, and preferably 1.5 to 1.9, depending on the exposure wavelength. The values of n and k can be calculated using an ellipsometer such as Woollam WVASE VU-32 (trademark) ellipsometer. The exact values in the optimal range for k and n depend on the exposure wavelength used to expose the resist film coated on the film of (2) and the application method.

Subsequently, a resist film can be manufactured by the method comprising the following processes:
 (3) applying a resist composition above the film (2), and
 (4) heating the resist composition to form a resist film.

Although this is described for clarity, the processes (1) and (2) are performed before the process (3). Numbers in parentheses indicating processes mean order. The same applies to the followings.

The resist composition is applied above the film (2) by an appropriate method. The application method is not particularly limited and can be the same as the above application.

The resist composition is not particularly limited, and any positive resist composition, negative resist composition or negative tone development (NTD) resist composition can be used as long as it is sensitive to exposure light for pattern formation. The resist composition to be used in the present invention is preferably a positive resist composition or a negative resist composition, and more preferably a chemically amplified positive resist composition or a chemically amplified negative resist composition. Further, the resist composition preferably comprises an acid generator or a base generator.

After application, a resist film is formed by heating. The heating temperature of (4) is preferably 80 to 250° C., more preferably 80 to 200° C., and further preferably 90 to 180° C. The heating time is preferably 30 to 600 seconds, more preferably 30 to 300 seconds, and further preferably 60 to 180 seconds. The heating is preferably performed in an air or nitrogen gas atmosphere.

The thickness of the resist film varies depending on the exposure wavelength but is preferably 100 to 50,000 nm. When a KrF excimer laser is used for exposure, the film thickness of the resist film is preferably 100 to 5,000 nm, more preferably 100 to 1,000 nm, and further preferably 400 to 600 nm.

Subsequently, a resist pattern can be manufactured by the method comprising the following processes:
 (5) exposing the resist film, and
 (6) developing the resist film.

Exposure is performed to the resist film through a predetermined mask. The wavelength of light to be used for exposure is not particularly limited, but it is preferable to expose with light having wavelength of 13.5 to 248 nm. In particular, KrF excimer laser (wavelength: 248 nm), ArF excimer laser (wavelength: 193 nm), extreme ultraviolet light (wavelength: 13.5 nm), or the like can be used, and KrF excimer laser is preferable. These wavelengths allow a range of ±1%. After exposure, post exposure bake can be performed as necessary. The post exposure heating temperature is preferably 80 to 150° C., more preferably 100 to 140° C., and the heating time is 0.3 to 5 minutes, preferably 0.5 to 2 minutes.

The exposed resist film is developed using a developer. The developer to be used is preferably a 2.38% by mass tetramethylammonium hydroxide (TMAH) aqueous solution. The temperature of the developer is preferably 5 to 50°

C., more preferably 25 to 40° C., and the development time is preferably 10 to 300 seconds, more preferably 30 to 60 seconds.

Using such a developer, the resist film and/or the film (2) can be easily dissolved and removed at room temperature. Further, to these developers, for example, a surfactant can also be added.

When a positive resist composition is used, the exposed portion of the positive photoresist layer is removed by development to form a resist pattern. The resist pattern can be further made finer, for example, using a shrink material.

Subsequently, a processed substrate can be manufactured by the method comprising the following process:

(7) etching with the resist pattern as a mask.

Using the resist pattern as a mask, the film (2) or substrate is preferably etched. At this time, the substrate can be processed by etching the film (2) and substrate at a time, or it is also possible to process in stages, in such a way that after etching the film (2), the substrate is etched using the film (2) as a mask. Etching can be either dry etching or wet etching. Thereby, a gap can be formed in the substrate or a layer on the substrate. After the gap is formed, the resist pattern can be removed by making it contact with water, a mixed solution of water-soluble organic solvent and water, or an alkaline aqueous solution. Further, it is also possible to form a wiring using the formed gap. In addition, the substrate can be processed by a method other than etching.

Thereafter, if necessary, the substrate is further processed to form a device. For these further processing, known methods can be applied. After forming the device, if necessary, the substrate is cut into chips, which are connected to a lead frame and packaged with resin. In the present invention, this packaged product is referred to as a device.

EXAMPLES

The present invention is described below with reference to examples. In addition, the aspect of the present invention is not limited only to these examples.

Synthesis of Polymer 1

In a three-necked flask, 350 g of PGMEA is put, and subsequently 32.79 g of MOI-BP (Karenz MOI-BP, Showa Denko), 20 g of McHN (Kawasaki Kasei Chemicals), 6.422 g of DYE-M9A (Osaka Shinyaku) and 8.16 g of HPMA (light ester HOP, Kyoeisha Chemical), which are shown below, are added. These fall under Unit (a), Unit (b), Unit (c) and Unit (d), respectively.

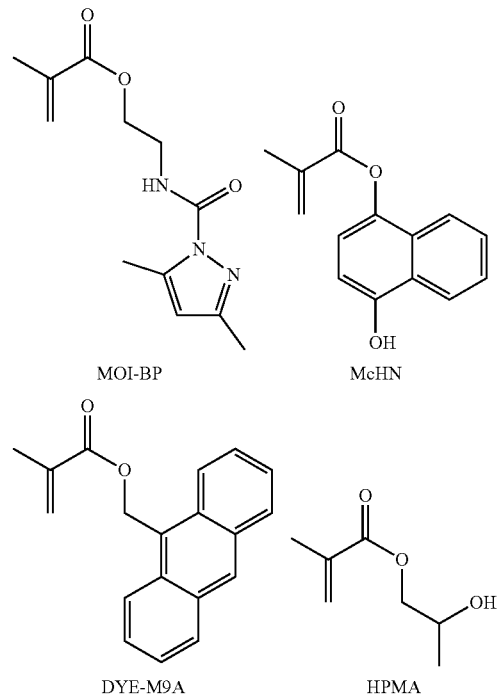

MOI-BP    McHN

DYE-M9A   HPMA

Subsequently, V-601/oil-soluble azo polymerization initiator (Fuji Film Wako Pure Chemical) is added. The three-necked flask is filled with nitrogen, covered, heated while stirring with a stirring bar, and the liquid is reacted at 80° C. for 4 hours. Subsequently, 3 g of PGME is added and stirred to complete the polymerization. The reaction liquid is returned to a room temperature. The reaction liquid is dropped into 1,500 g of hexane to precipitate polymer. This is filtered and dried under reduced pressure to obtain Polymer 1.

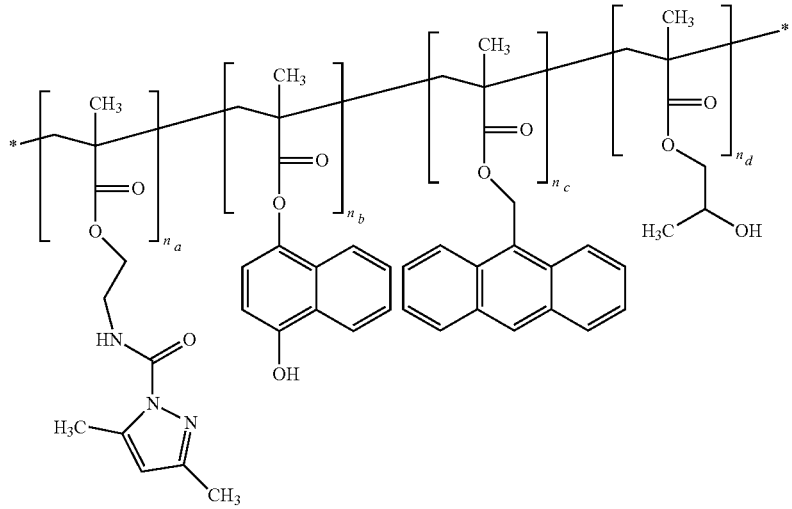

Polymer 1 (molar ratio, $n_a:n_b:n_c:n_d$=26:49:14:11): When measured by GPC (elution solvent: tetrahydrofuran), Mn of polymer 1 is 9,900 and Mw is 22,200.

Synthesis of Polymers 2 to 11 and Comparative Polymers 1 and 2

The synthesis is performed in the same manner as in the above-described synthesis example of Polymer 1 except that the molar ratio of Unit (a), Unit (b), Unit (c) and Unit (d) is changed as shown in Table 1. Polymers 2 to 11 and Comparative Polymers 1 and 2 are obtained.

It is capable of visually confirming that Comparative Polymers 1 and 2 are gelled. Comparative Polymers 1 and 2 are judged to be unsuitable for fine processing and are not subjected to subsequent evaluations.

Mn and Mw of each polymer are measured by GPC (elution solvent tetrahydrofuran) and they are as shown in Table 1.

TABLE 1

| | Unit (a) | Unit (b) | Unit (c) | Unit (d) | Mn/Mw |
|---|---|---|---|---|---|
| Polymer 1 | 26 | 49 | 14 | 11 | 9,900/22,200 |
| Polymer 2 | 49 | 40 | 11 | 0 | 9,800/39,000 |
| Polymer 3 | 26 | 49 | 12 | 13 | 8,600/20,200 |
| Polymer 4 | 25 | 49 | 14 | 12 | 7,800/19,600 |
| Polymer 5 | 18 | 49 | 14 | 19 | 9,200/20,000 |
| Polymer 6 | 11 | 49 | 14 | 26 | 1,1300/25,100 |
| Polymer 7 | 18 | 59 | 12 | 11 | 8,400/19,900 |
| Polymer 8 | 44 | 29 | 8 | 19 | 10,100/22,000 |
| Polymer 9 | 33 | 49 | 8 | 30 | 10,100/22,000 |
| Polymer 10 | 0 | 55 | 15 | 30 | 4,200/17,800 |
| Polymer 11 | 0 | 15 | 5 | 80 | 5,800/19,400 |
| Comparative Polymer 1 | 0 | 0 | 50 | 50 | gelation |
| Comparative Polymer 2 | 0 | 0 | 33 | 67 | gelation |

Preparation of Composition 1

Surfactant (MEGAFACE R-40, DIC) is dissolved in PGMEA so as to be 5% by mass. This is designated as the 5% by mass surfactant solution.

As the solvent, 68.4 g of PGMEA and 29.4 g of PGME are mixed. To this, 0.04 g of camphorsulfonic acid (Fuji Film Wako Pure Chemical) and 0.018 g of triethylamine (Kanto Chemical) are added. These function as a thermal acid generator.

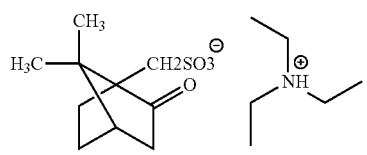

To this, 2 g of Polymer 1 and 0.048 g of the 5% by mass surfactant solution are added, and stirred and mixed at room temperature for 1 hour. Thereby, Composition 1 is obtained.

When visually observed Composition 1, it is capable of confirming that the solute is dissolved.

Preparation of Compositions 2 to 11

The preparation is performed in the same manner as the preparation of Composition 1 except that the polymer used is changed as shown in Table 2, and Compositions 2 to 11 are obtained.

When visually observed each composition, it is capable of confirming that the solute is dissolved.

Preparation of Composition 12

Surfactant (MEGAFACE R-40) is dissolved in PGMEA so as to be 5% by mass. This is designated as the 5% by mass surfactant solution.

As the solvent, 68.4 g of PGMEA and 29.4 g of PGME are mixed. To this, 0.04 g of camphorsulfonic acid and 0.018 g of triethylamine are added. These function as a thermal acid generator.

To this, 2 g of Polymer 1, 0.6 g of the following crosslinker NIKALAC MX-270 (Sanwa Chemical) and 0.048 g of the 5% by mass surfactant solution are added, and stirred and mixed at room temperature for 1 hour. Thereby, Composition 12 is obtained.

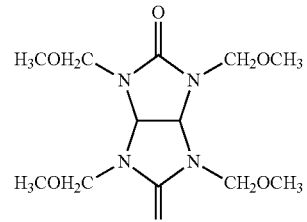

When visually observed Composition 12, it is capable of confirming that the solute is dissolved.

Preparation of Compositions 13 and 14

The preparation is performed in the same manner as the preparation of Composition 12 except that the polymer used is changed as shown in Table 2, and Compositions 13 and 14 are obtained.

When visually observed each composition, it is capable of confirming that the solute is dissolved.

Preparation of Comparative Composition 1

The following P090D polymer is dissolved in PGMEA so as to be 17% by mass. This is designated as the P090D polymer solution.

Surfactant (MEGAFACE R-40) is dissolved in PGMEA so as to be 5% by mass. This is designated as the 5% by mass surfactant solution.

As the solvent, 68.4 g of PGMEA and 29.4 g of PGME are mixed. To this, 0.04 g of camphorsulfonic acid and 0.018 g of triethylamine are added. These function as a thermal acid generator. To this, 3.2 g of the following VPS-2515 (poly(hydroxystyrene/styrene) copolymer), 4.6 g of the P090D polymer solution, 0.6 g of a crosslinker (TMOM-BP) and 0.048 g of the 5% by mass surfactant solution are added, and stirred and mixed at room temperature for 1 hour. Thereby, Comparative Composition 1 is obtained. Hereinafter, for simplification, when VPS-2515 and P090D are polymer components, they are described as VPS+P090D.

When visually observed Comparative Composition 1, it is capable of confirming that the solute is dissolved.

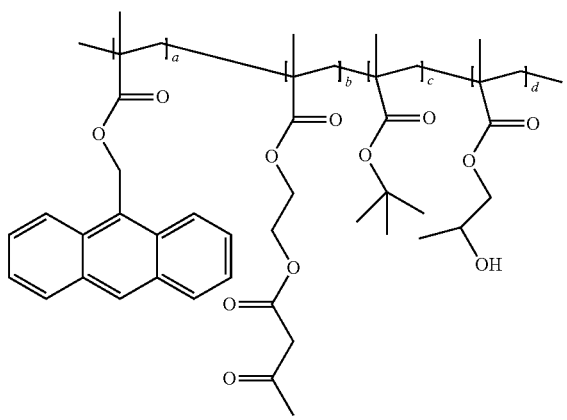

(P090D polymer, TOHO Chemical; a:b:c:d=35.7:35.7:17.9:10.7; molecular weight: 4,000 to 8,000)

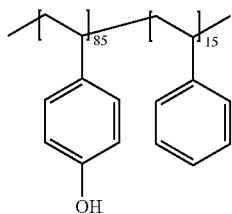

(VPS-2515, Nippon Soda; molecular weight: 3,300 to 4,300)

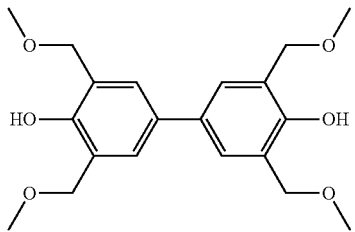

(TMOM-BP, Honshu Chemical Industry)

Preparation of Comparative Composition 2

The P090D polymer is dissolved in PGMEA so as to be 17% by mass. This is designated as the P090D polymer solution.

Surfactant (MEGAFACE R-40) is dissolved in PGMEA so as to be 5% by mass. This is designated as the 5% by mass surfactant solution.

As the solvent, 68.4 g of PGMEA and 29.4 g of PGME are mixed. To this, 0.04 g of camphorsulfonic acid and 0.018 g of triethylamine are added. These function as a thermal acid generator.

To this, 3.2 g of poly(hydroxystyrene/styrene) copolymer (VPS-2515), 4.6 g of the P090D polymer solution, and 0.048 g of the 5% by mass surfactant solution are added, and stirred and mixed at room temperature for 1 hour. Thereby, Comparative Composition 2 is obtained.

When visually observed Comparative Composition 1, it is capable of confirming that the solute is dissolved.

Evaluation of Film Formation

Using a coater/developer, Mark 8 (manufactured by Tokyo Electron Ltd.), each composition is spin-coated on a Si bare wafer. The wafer is baked in an air at 180° C. for 60 seconds to form a film.

By this process, if a film is formed from the composition, the film formation is evaluated as A, and if no film is formed, the film formation is evaluated as B. The evaluation results are shown in Table 2.

When measured with LambdaAce VM-1210 (SCREEN), the film thickness is 45 nm.

Evaluation of Uniformity

Uniformity of the film formed by the above film formation is evaluated. The evaluation criteria are as described below. The evaluation results are shown in Table 2.

A: Through visual observation, it is confirmed uniformly applied.

B: Through visual observation, presence of spots is confirmed.

In addition, the film formed using Composition 1 has a difference between the maximum value and the minimum value of 2 nm or less when the film thickness is measured at 21 points on a straight line.

TABLE 2

|  | Polymer (A) | Crosslinker | Film formation | Uniformity |
| --- | --- | --- | --- | --- |
| Composition 1 | Polymer 1 | Not included | A | A |
| Composition 2 | Polymer 2 | Not included | A | A |
| Composition 3 | Polymer 3 | Not included | A | A |
| Composition 4 | Polymer 4 | Not included | A | A |
| Composition 5 | Polymer 5 | Not included | A | A |
| Composition 6 | Polymer 6 | Not included | A | A |
| Composition 7 | Polymer 7 | Not included | A | A |
| Composition 8 | Polymer 8 | Not included | A | A |
| Composition 9 | Polymer 9 | Not included | A | A |
| Composition 10 | Polymer 10 | Not included | A | A |
| Composition 11 | Polymer 11 | Not included | A | A |
| Composition 12 | Polymer 1 | Included | A | A |
| Composition 13 | Polymer 10 | Included | A | A |
| Composition 14 | Polymer 11 | Included | A | A |
| Comparative Composition 1 | VPS + P090D | Included | A | A |
| Comparative Composition 2 | VPS + P090D | Not included | A | A |

Evaluation of Optical Constants

Optical constants of the film formed by the above film formation are evaluated. Reflected light is measured with Ellipsometer M2000-D (J. A. Woollam) and wavelength of 248 nm. Thereby, optical constants n value and k value are obtained. The evaluation results are shown in Table 3.

It is capable of confirming that the film formed from Composition 1 has sufficient characteristics as an antireflection film.

Evaluation of Filling Properties

Each composition is spin-coated on a silicon substrate with level difference (line space ratio: 1:2, pitch width: 48 nm (L16 nm/S32 nm), depth: 100 nm), and a section of the substrate is observed with SEM and filling properties is evaluated. The evaluation criteria are as described below. The evaluation results are shown in Table 3.

A: In the SEM photograph, no voids are observed in the level difference where the composition is filled.

B: In the SEM photograph, some voids exist in a part of the level difference where the composition is filled.

Evaluation of Crosslinkability

The film thickness of the film formed by the above film formation is designated as the initial film thickness. The wafer is immersed in a PGMEA/PGME solution (AZ EBR7030, Merck Performance Materials, hereinafter referred to as MPM) for 60 seconds, then spin-dried, and the film thickness is measured again. When the decrease width of the film thickness is less than 2 nm compared with the initial film thickness, it is evaluated that the crosslinking is sufficient. In the case of sufficient crosslinking, the baking temperature at the film formation is lowered sequentially to 170° C., 160° C. and 150° C., and the same experiment and evaluation are performed until the film thickness decreased to 2 nm or more (insufficient crosslinking). Through this, confirmation of crosslinkability is conducted. Conditions of the baking temperature immediately before crosslinking becomes insufficient (temperature at which crosslinking is sufficient) are shown in the table.

When the film of 10 nm or more is dissolved by the PGMEA/PGME solution, it is evaluated as B.

The evaluation results are shown in Table 3.

Formation of Resist Pattern

A resist composition (AZ DX3200P, MPM) is spin-coated on the film formed by the above film formation, and baked at 90° C. for 60 seconds. Thereby, a resist film having film thickness of 580 nm is formed.

This wafer is exposed with PFA-3000 EX-5 (Canon) under the conditions of wavelength: 248 nm, mask size=200 nm, and line:space=1:1. The exposed wafer is subjected to post-exposure baking treatment at 120° C. for 90 seconds, and developed using a 2.38% by mass TMAH aqueous solution for 60 seconds. The resultant is rinsed with water and spin-dried. Thereby, a resist pattern is formed.

Evaluation of Standing Wave

The resist pattern formed above is observed with a scanning electron microscope and the state of standing wave is evaluated. The evaluation criteria are as follows. The evaluation results are shown in Table 3.

A: A reduction of the standing wave is observed. The resist wall surface is hardly waved.
B: A reduction of the standing wave is observed. The resist wall surface is slightly waved.
C: A reduction of standing wave is not indicated.

Composition 1 is applied on a silicon wafer substrate having a diameter of 4 inches with a spin coater at 2,500 rpm for 60 seconds. The film thickness is measured to be 78 nm.

The above wafer is set in a sublimate measuring device integrated with a hot plate, which is adjusted to 205° C., and baked for 60 seconds, and the sublimate is collected and determined the quantity using a QCM sensor (TH-Q100 and Sensor SEN-9E-H10, TAMADEVICE).

Measurement is performed by raising the temperature of the hot plate to 180° C., setting the pump flow rate to 1 m³/s and leaving the sublimate for aging for the first 60 seconds. Immediately after that, the wafer coated with the film is quickly put on the hot plate from the slide aperture (measuring object is installed), and the sublimate from the time point of 60 seconds to that of 120 seconds (for 60 seconds) is collected.

A nozzle with a diameter of 2 mm is attached to the flow attachment (detection part) connecting the QCM sensor and the collection funnel part, and the distance between the sensor and the nozzle is kept at 0.5 mm. Further, a QCM sensor, for which an electrode made of a compound containing silicon and aluminum is used and which has a crystal resonator with a diameter (sensor diameter) of 14 mm, a crystal resonator surface electrode diameter of 5 mm and a resonance frequency of 9 MHz, is used.

Evaluation criteria are as follows.

A: Sublimated amount<0.1 ng
B: Sublimated amount≥0.1 ng, ≤0.5 ng
C: Sublimated amount>0.5 ng Also for each composition described in Table 4, tests and evaluations are performed in the same way as those described above. The results are shown in Table 4.

TABLE 4

|  | Polymer (A) | Crosslinker | Sublimate |
|---|---|---|---|
| Composition 1 | Polymer 1 | Not included | A |
| Composition 2 | Polymer 2 | Not included | A |

TABLE 3

|  | Polymer (A) | Crosslinker | n value | k value | Filling properties | Crosslink ability | Standing wave |
|---|---|---|---|---|---|---|---|
| Composition 1 | Polymer 1 | Not included | 1.8 | 0.32 | A | 150° C. | A |
| Composition 2 | Polymer 2 | Not included | 1.79 | 0.31 | A | 160° C. | A |
| Composition 3 | Polymer 3 | Not included | 1.83 | 0.28 | A | 150° C. | A |
| Composition 4 | Polymer 4 | Not included | 1.8 | 0.31 | A | 150° C. | A |
| Composition 5 | Polymer 5 | Not included | 1.8 | 0.32 | A | 150° C. | A |
| Composition 6 | Polymer 6 | Not included | 1.8 | 0.32 | A | 150° C. | A |
| Composition 7 | Polymer 7 | Not included | 1.85 | 0.3 | A | 150° C. | A |
| Composition 8 | Polymer 8 | Not included | 1.81 | 0.31 | A | 150° C. | A |
| Composition 9 | Polymer 9 | Not included | 1.81 | 0.31 | A | 150° C. | A |
| Composition 10 | Polymer 10 | Not included | 1.83 | 0.36 | A | B | B |
| Composition 11 | Polymer 11 | Not included | 1.64 | 0.14 | A | B | B |
| Composition 12 | Polymer 1 | Included | 1.81 | 0.31 | A | 150° C. | A |
| Composition 13 | Polymer 10 | Included | 1.83 | 0.36 | A | 150° C. | A |
| Composition 14 | Polymer 11 | Included | 1.64 | 0.14 | A | 150° C. | A |
| Comparative Composition 1 | VPS + P090D | Not included | 1.8 | 0.01 | A | B | B |
| Comparative Composition 2 | VPS + P090D | Included | 1.8 | 0.01 | A | 180° C. | A |

Evaluation of Sublimate

The test and evaluation according to the measuring method of the sublimate in thermally set film using the QCM sensor described in WO2007/111147 (Patent Document 3) are performed.

TABLE 4-continued

|  | Polymer (A) | Crosslinker | Sublimate |
|---|---|---|---|
| Composition 3 | Polymer 3 | Not included | A |
| Composition 4 | Polymer 4 | Not included | A |

TABLE 4-continued

| | Polymer (A) | Crosslinker | Sublimate |
|---|---|---|---|
| Composition 5 | Polymer 5 | Not included | A |
| Composition 6 | Polymer 6 | Not included | A |
| Composition 7 | Polymer 7 | Not included | A |
| Composition 8 | Polymer 8 | Not included | A |
| Composition 9 | Polymer 9 | Not included | A |
| Composition 10 | Polymer 10 | Not included | B |
| Composition 11 | Polymer 11 | Not included | B |
| Composition 12 | Polymer 10 | Included | C |
| Composition 13 | Polymer 11 | Included | C |
| Comparative Composition 1 | VPS + P090D | Not included | A |
| Comparative Composition 2 | VPS + P090D | Included | B |

When a film is formed from Compositions 1 to 9 made of Polymers 1 to 9, it is confirmed that the generation of sublimate is small. Using these compositions, contamination of the apparatus can be prevented, and it is considered good in the manufacturing process.

The invention claimed is:

1. A method for manufacturing a resist film comprising:
   (1) applying a resist underlayer composition above a substrate;
   (2) heating said resist underlayer composition to form a resist underlayer film;
   (3) applying a resist composition above the resist underlayer film; and
   (4) heating said resist composition to form a resist film,
   wherein the resist underlayer composition comprises a polymer (A) and a solvent (B);
   where polymer (A) comprises at least one structural unit selected from the group consisting of the following Units (a), (b), (c) and (d):
   Unit (a) represented by the formula (a):

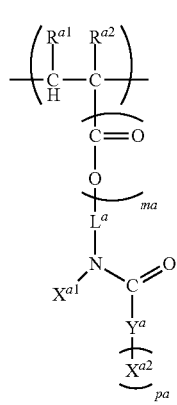

wherein,
$R^{a1}$ and $R^{a2}$ are each independently H, $C_{1-5}$ alkyl, $C_{1-5}$ alkoxy or —COOH,
$L^a$ is a single bond, $C_{1-5}$ alkylene, —O— or $C_{1-5}$ alkoxylene,
ma is 1,
$X^{a1}$ is H or a $C_{1-5}$ hydrocarbon group (one or more of —$CH_2$— in the $C_{1-5}$ hydrocarbon group can be each independently replaced with —NH—, —C(=O)— and/or —O— and one or more of —$CH_3$ in the $C_{1-5}$ hydrocarbon group can be each independently replaced with —$NH_2$ and/or —COOH),
$Y^a$ is N or O, where when $Y^a$ is N, pa is an integer of 1 or 2, and when $Y^a$ is O, pa is 1, $X^{a2}$ is H or a $C_{1-5}$ hydrocarbon group (one or more of —$CH_2$— in the $C_{1-5}$ hydrocarbon group can be each independently replaced with —NH—, —C(=O)— and/or —O— and one or more of —$CH_3$ in the $C_{1-5}$ hydrocarbon group can be each independently replaced with —$NH_2$ and/or —COOH), and when pa is 2, two $X^{a2}$ can be identical or different, where, $X^{a1}$ and $X^{a2}$ can be bonded and/or two $X^{a2}$ can be bonded when pa is 2, to form a saturated or unsaturated ring;

Unit (b) selected from the group consisting of:

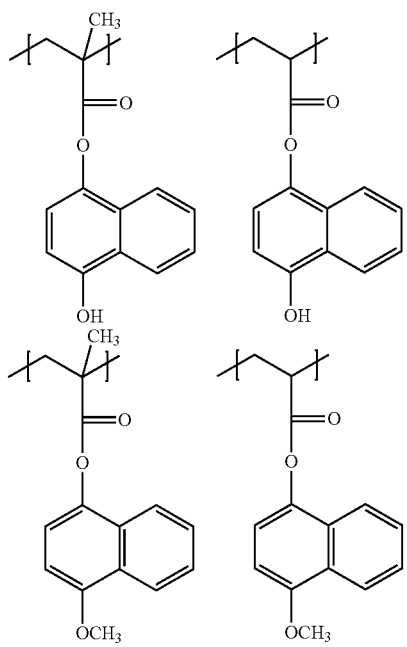

Unit (c) represented by the formula (c):

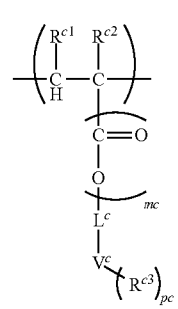

wherein,
$R^{c1}$ and $R^{c2}$ are each independently H, $C_{1-5}$ alkyl, $C_{1-5}$ alkoxy or —COOH,
mc is 1,
$L^c$ is a single bond, $C_{1-5}$ alkylene, —O— or $C_{1-5}$ alkoxylene,
$V^c$ is a fused aromatic hydrocarbon or a fused heterocyclic ring, and $V^c$ has 3 to 6 rings fused,
pc is 0 to 5, $R^{c3}$ is $C_{1-5}$ alkyl, $C_{1-5}$ alkoxy or —COOH, and when pc>1, each $R^{c3}$ can be identical or different; and Unit (d) represented by the formula (d):

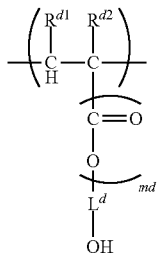

wherein,
$R^{d1}$ and $R^{d2}$ are each independently H, $C_{1-5}$ alkyl, $C_{1-5}$ alkoxy or —COOH,
md is 1,
$L^d$ is a single bond, $C_{1-5}$ alkylene wherein one or more of —$CH_2$— in the $C_{1-5}$ alkylene can be replaced with —NH—, —C(=O)— and/or —O— and one or more of —$CH_3$ in the $C_{1-5}$ alkylene can be replaced with —OH, —$NH_2$ and/or —COOH, —O— or $C_{1-5}$ alkoxylene, wherein, $n_a$, $n_b$, $n_c$ and $n_d$, which are the molar numbers of repetition respectively of Units (a), (b), (c) and (d);

wherein the polymer (A) satisfies the following formulae:

$$5\% \leq n_d/(n_a+n_b+n_c+n_d) \leq 50\%,$$

$$30\% \leq n_b/(n_a+n_b+n_c+n_d) \leq 80\%, \text{ and}$$

$$5\% \leq n_c/(n_a+n_b+n_c+n_d) \leq 40\%$$

wherein the total molar number ($n_{total}$) of all repeating units contained in the polymer (A) satisfies the following formula:

$$80\% \leq (n_a+n_b+n_c+n_d)/n_{total} \leq 100\%.$$

2. The method according to claim 1, wherein said solvent (B) comprises water, a hydrocarbon solvent, an ether solvent, an ester solvent, an alcohol solvent or a ketone solvent.

3. The method according to claim 1, wherein the resist underlay composition further comprises a crosslinker (C), where the content of the crosslinker (C) is optionally up to 5% by mass based on the total mass of the polymer (A) in the resist underlayer composition.

4. The method according to claim 3, wherein the resist underlayer composition further comprises an acid generator (D), where the content of the acid generator (D) is optionally 0.01 to 10% by mass based on the total mass of the polymer (A) in the resist underlayer composition, and which optionally further comprises a surfactant (E), where the content of the surfactant (E) is optionally 0.001 to 5% by mass based on the total mass of the polymer (A) in the resist underlayer composition.

5. The method according to claim 4, wherein the resist underlayer composition further comprises at least one other additive (F), where the at least one other additive (F) is optionally selected from the group consisting of a base generator, a smoothing agent, a monomeric dye, a lower alcohol ($C_{1-6}$ alcohol), a surface leveling agent, a substrate adhesion agent, an antifoaming agent, an antiseptic, and combinations thereof, where the content of the additive (F) is optionally an amount up to 10% by mass based on the total mass of the polymer (A) in the resist underlayer composition.

6. The method according to claim 1, wherein the resist underlayer composition further comprises an acid generator (D), where the content of the acid generator (D) is 0.01 to 10% by mass based on the total mass of the polymer (A) in the resist underlayer composition, and which further comprises a surfactant (E), where the content of the surfactant (E) is 0.001 to 5% by mass based on the total mass of the polymer (A) in the resist underlayer composition.

7. The method according to claim 1, wherein the resist underlayer composition further comprises at least one other additive (F), where the at least one other additive (F) is optionally selected from the group consisting of a base generator, a smoothing agent, a monomeric dye, a lower alcohol ($C_{1-6}$ alcohol), a surface leveling agent, a substrate adhesion agent, an antifoaming agent, an antiseptic, and combinations thereof.

8. The method according to claim 1, wherein the content of the polymer (A) is 1 to 30% by mass and the content of the solvent (B) is optionally 50 to 99% by mass, based on the total mass of the resist underlayer composition.

9. The method according to claim 1, wherein the mass average molecular weight of the polymer (A) is 1,000 to 50,000.

10. The method for manufacturing a film according to claim 1, where the polymer (A) consists of Units (a), (b), (c) and (d).

11. The method for manufacturing a film according to claim 1
wherein,
the heating in said (2) is performed at 100 to 250° C. and/or for 30 to 300 seconds, or
the heating in said (2) is performed in an air or nitrogen gas atmosphere, and the thickness of the formed film is 10 to 1,000 nm.

12. The method for manufacturing a resist film according to claim 1
wherein,
the heating in said (4) is performed at 80 to 250° C. and/or for 30 to 600 seconds,
the heating in said (4) is performed in an air or nitrogen gas atmosphere, or
the thickness of the formed resist film is 100 to 50,000 nm.

13. A method for manufacturing a resist pattern comprising the following processes: manufacturing a resist film by the method according to claim 1,
(5) exposing said resist film, and
(6) developing said resist film,
wherein,
the exposure in said (5) is optionally performed using a light source of 248 nm±1% or 193 nm±1%,
said resist composition is optionally a chemically amplified resist composition, said resist composition is optionally a positive resist composition or a negative resist composition, or
said resist composition optionally comprises an acid generator or a base generator.

14. A method for manufacturing a processed substrate comprising the following processes: manufacturing a resist pattern by the method according to claim 13; and
(7) etching with the resist pattern as a mask,
wherein,
said (7) is optionally to etch the film in said (2), or the substrate.

15. A method for manufacturing a device comprising the method according to claim 14.

\* \* \* \* \*